(12) United States Patent
Khandan et al.

(10) Patent No.: US 12,588,426 B2
(45) Date of Patent: Mar. 24, 2026

(54) SUSCEPTOR FOR A CHEMICAL VAPOR DEPOSITION REACTOR

(71) Applicant: MetOxTechnologies, Inc., Houston, TX (US)

(72) Inventors: Shahab Khandan, Houston, TX (US); Alex Ignatiev, Houston, TX (US); Mikhail Novozhilov, Houston, TX (US); W. James Jewitt, Houston, TX (US)

(73) Assignee: MetOx International, Inc., Houston, TX (US)

( * ) Notice: Subject to any disclaimer, the term of this patent is extended or adjusted under 35 U.S.C. 154(b) by 448 days.

(21) Appl. No.: 17/795,067

(22) PCT Filed: Feb. 12, 2021

(86) PCT No.: PCT/US2021/017935
§ 371 (c)(1),
(2) Date: Jul. 25, 2022

(87) PCT Pub. No.: WO2021/167847
PCT Pub. Date: Aug. 26, 2021

(65) Prior Publication Data
US 2023/0079651 A1 Mar. 16, 2023

Related U.S. Application Data

(60) Provisional application No. 62/979,352, filed on Feb. 20, 2020.

(51) Int. Cl.
*C23C 16/44* (2006.01)
*C23C 16/458* (2006.01)
(Continued)

(52) U.S. Cl.
CPC ..... *H10N 60/0464* (2023.02); *C23C 16/4412* (2013.01); *C23C 16/4586* (2013.01);
(Continued)

(58) Field of Classification Search
None
See application file for complete search history.

(56) References Cited

U.S. PATENT DOCUMENTS 6,503,131 B1 * 1/2003 Franklin ................. B24B 37/16
451/296
8,148,300 B2 * 4/2012 Matsumoto ........ H10N 60/0828
505/477
(Continued)

FOREIGN PATENT DOCUMENTS

KR 100910613 B1 * 8/2009 ........... C23C 14/562

OTHER PUBLICATIONS

International Search Report issued in relation to International Application No. PCT/US2021/17935.
(Continued)

*Primary Examiner* — Sylvia Macarthur

(57) ABSTRACT

A susceptor used in a deposition reactor provides heat input and controls the build-up of errant deposition. The susceptor heats a substrate tape within the reactor upon which one or more thin films are deposited, particularly high temperature superconductor (HTS) thin films produced in a MOCVD reactor.

19 Claims, 8 Drawing Sheets

(51) Int. Cl.

| | |
|---|---|
| *C23C 16/46* | (2006.01) |
| *C23C 16/52* | (2006.01) |
| *C23C 16/54* | (2006.01) |
| *H10N 60/01* | (2023.01) |

(52) U.S. Cl.
CPC .............. *C23C 16/46* (2013.01); *C23C 16/52* (2013.01); *C23C 16/545* (2013.01)

(56)    References Cited

U.S. PATENT DOCUMENTS

| | | | | |
|---|---|---|---|---|
| 8,685,166 | B2 * | 4/2014 | Youm ..................... | H10N 60/01 |
| | | | | 118/718 |
| 11,214,872 | B2 * | 1/2022 | Hsieh ...................... | C30B 25/08 |
| 2003/0066604 | A1 * | 4/2003 | Franklin ................ | B24B 21/04 |
| | | | | 156/345.23 |
| 2005/0223984 | A1 | 10/2005 | Lee | |
| 2012/0180725 | A1 | 7/2012 | Yasunaga | |
| 2012/0329658 | A1 * | 12/2012 | Moon .................. | H10N 60/203 |
| | | | | 117/54 |
| 2019/0194820 | A1 | 6/2019 | Claessens | |
| 2023/0079651 | A1 * | 3/2023 | Khandan ............. | C23C 16/4412 |
| | | | | 118/725 |

OTHER PUBLICATIONS

International Written Opinion issued in relation to International Application No. PCT/US2021/17935.

* cited by examiner 200
230 / 240    220
FIG. 3B
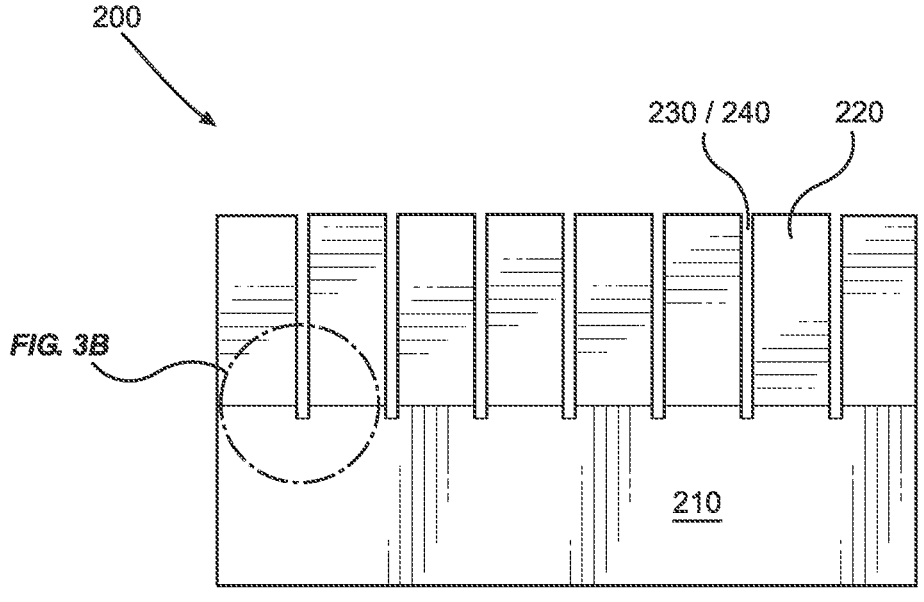
210
FIG. 3A
230 / 240
220
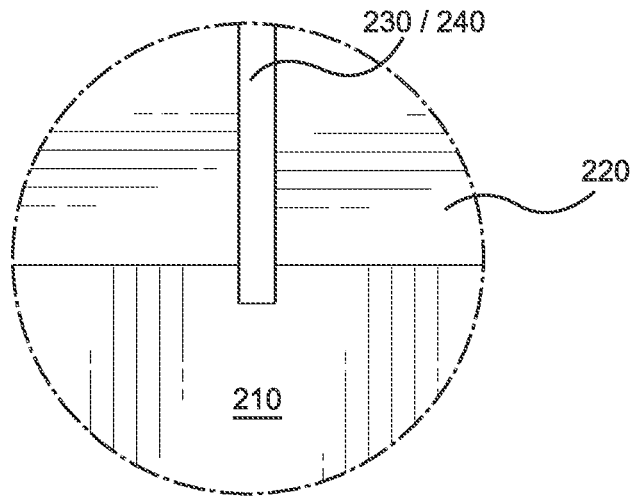
210
FIG. 3B

200
230 / 240
220
FIG. 5B
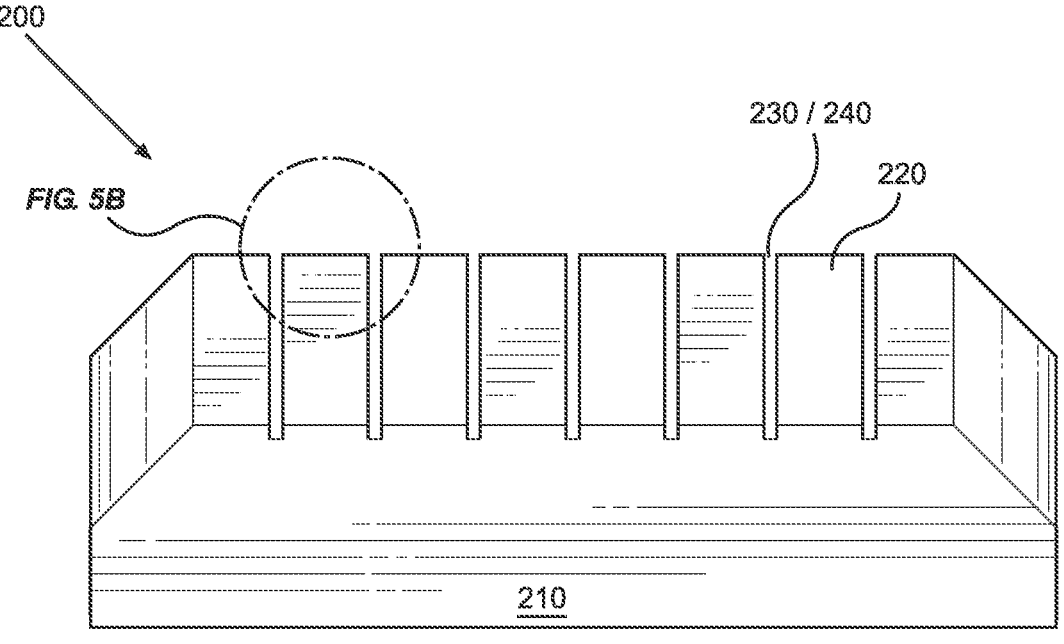
210
FIG. 5A
230 / 240          310
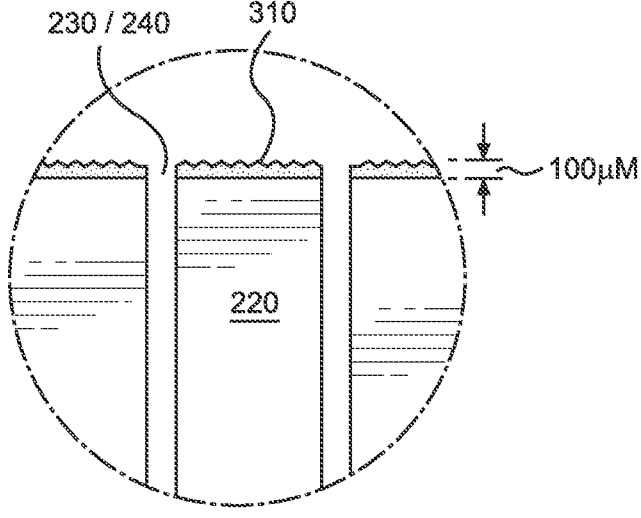
100μM
220
FIG. 5B

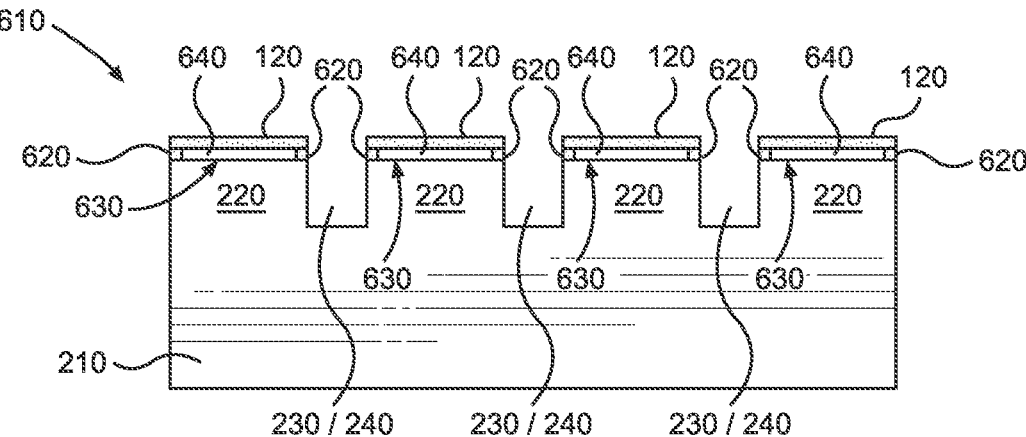
FIG. 6A
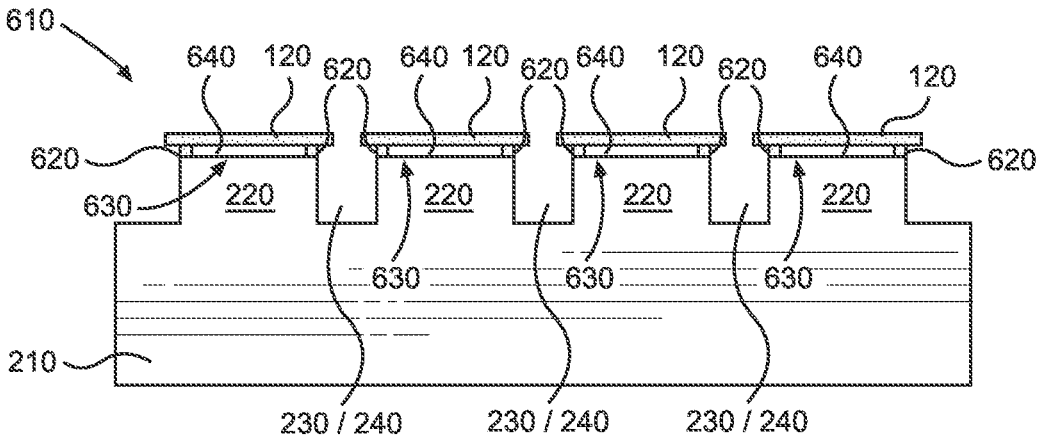
FIG. 6B
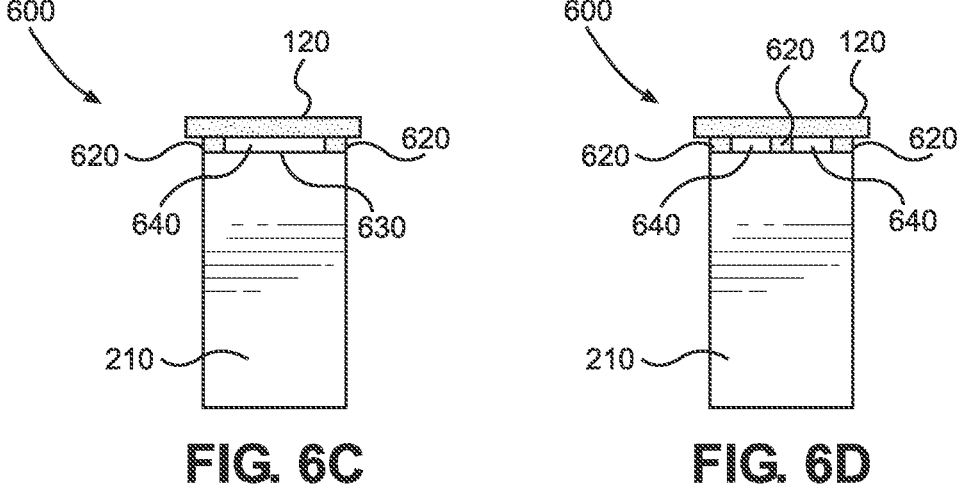
FIG. 6C            FIG. 6D

SUSCEPTOR FOR A CHEMICAL VAPOR DEPOSITION REACTOR

CROSS REFERENCE TO RELATED APPLICATIONS

This application claims priority and benefit from U.S. Provisional Patent Application No. 62/979,352 filed on Feb. 20, 2020, for "CVD Reactor Susceptor for HTS Deposition," the content of which is incorporated in its entirety herein by reference.

BACKGROUND OF THE INVENTION

Technical Field

Embodiments of the subject matter disclosed herein generally relate to susceptor devices and systems utilizing said susceptors in a deposition reactor and more particularly in vapor deposition reactors for fabricating high-temperature superconductors on substrate tapes.

Discussion of the Background

High temperature superconductors (HTS) provide the potential for development of superconductor components at higher operating temperatures compared to traditional superconductors that operate at liquid helium temperature (4.2K). Superconductors operating at the higher temperatures thus provide the ability to develop superconducting components and products more economically. Thin film HTS material comprised of $YBa_2Cu_3O_{7-x}$ (YBCO), is one of a group of oxide-based superconductors. After the initial discovery of YBCO superconductors, other superconductors were discovered having a similar chemical composition but with Y replaced by other rare earth elements. This family of superconductors is often denoted as REBCO where RE may include Y, La, Nd, Sm, Eu, Gd, Tb, Dy, Ho, Er, Tm, Yb or Lu. This material formed the basis for second generation or "2G" HTS wire technology which provides a more cost-effective material for manufacturing HTS tapes and wires.

Such HTS films are typically deposited as textured REBCO thin films which may include one or more buffer layers onto an atomically textured metal substrate. In the case of MOCVD, an organic ligand may comprise a vapor phase precursor delivered to the substrate for deposition. In the manufacturing of High Temperature Superconductors (HTS) via chemical vapor deposition (CVD) or metal-organic chemical vapor deposition (MOCVD) processing, a stainless steel or Hastelloy substrate tape is heated to high temperature, for example, 800° C. to 900° C. for the vapor phase precursor materials to deposit on the substrate tape and HTS film growth to occur.

There are different devices and methods for heating a substrate tape, including IR lamps that heat the tape via radiation, and hot block susceptors that directly contact the substrate tape and provide the needed heat via conduction. A typical CVD reactor 100 is shown in FIG. 1 and includes using a hot block type susceptor 110 that supports and heats a translating substrate tape 120. Reactor 100 is maintained at vacuum via an outlet port 130 and precursor reactant(s) 140 are introduced via a showerhead 150. Radiation lamps 160 may be included to aid thin film 170 growth on substrate 120. A disadvantage to using a heated susceptor 110 in a CVD process is that errant deposition 180 occurs and builds up on the exposed surfaces of the susceptor 110 and other components of the reactor.

Particularly in CVD reactors under vacuum, precursor vapor undergoes expansion and is prone to deposit on exposed surfaces of the susceptor outside the intended target deposition zone on the tape where HTS film growth is desired. Over long process times, the errant material deposited on the susceptor may build up to exceed the tape thickness that may be between 30 to 100 micrometers thickness, for example. Such errant deposition buildup on susceptor surfaces near the tape edges themselves can cause degradation to the properties of the HTS film grown on the tape. For example, the precursor boundary layer flow uniformity on and around the tape may be impacted by errant deposition, e.g., the heat transfer and the radiation properties of the errant material build-up may be different than the HTS film which can cause local edge temperature non-uniformity on the tape; and/or the built-up material itself may break away, become entrained within micro-eddies, and disturb the deposited layers causing performance degradation of the HTS film.

Finally, build-up of errant deposition material on the susceptor is a major limiting factor in the ability to run continuous and lengthy HTS process runs. For example, errant deposition material build-up may prevent the system from processing kilometers long HTS tapes due to a need to stop processing and disassemble the reactor for cleaning. For these reasons, new susceptor devices and systems are needed to control errant deposition particularly in areas proximal to the target tape substrate deposition zone.

SUMMARY OF EXAMPLE EMBODIMENTS

According to an embodiment, there is a susceptor for heating and temperature control of a substrate tape and for the control of errant deposition build-up within a deposition apparatus. The susceptor includes a main body forming a base of the susceptor, two or more adjacent raised sections each extending vertically from the upper surface of the main body and lengthwise along the length of the main body with the top of each raised section having a width substantially the same or less than the width of a substrate tape. Each raised section is separated by a gap from an adjacent raised section which forms a channel to collect errant deposition material.

According to another embodiment, there is a susceptor for heating and temperature control of a substrate tape and for the control of errant deposition build-up within a deposition apparatus. The susceptor includes a main body that forms a base of the susceptor and two or more adjacent raised sections each extending vertically from the upper surface of the main body and lengthwise along the length of the main body with the top of each raised section further comprises two or more support ridges to elevate a substrate tape such that the bottom of said substrate tape does not contact the raised section top surface. The distance between outermost edges of two support ridges of a raised section is substantially the same or less than the width of the substrate tape and each raised section is separated by a gap from an adjacent raised section which forms a channel to collect errant deposition material. In the context discussed herein, the term errant deposition will refer to deposition of material that occurs in an area of a reactor other than in the intended deposition zone, which may typically be upon a substrate.

According to another embodiment, there is a susceptor for heating and temperature control of a substrate tape within a deposition apparatus. The susceptor includes a main body forming a base of the susceptor and two or more support ridges located on the upper surface of the main body to elevate a substrate tape such that the bottom of said substrate tape does not contact the upper surface of the main body of the susceptor.

According to yet another embodiment there is a system for heating and temperature control of a substrate tape and control of errant deposition build-up within a chemical vapor deposition apparatus. The system includes a chemical vapor deposition apparatus with a reactor housing having an inlet for a precursor, a vacuum exhaust, a susceptor located within the reactor housing, a substrate tape configured to translate along the top of the susceptor and through the reactor housing, and a heater coupled to the susceptor. The susceptor further comprises a channel configured for collection of errant deposition build-up.

BRIEF DESCRIPTION OF THE DRAWINGS

The accompanying drawings, which are incorporated in and constitute a part of the specification, illustrate one or more embodiments and, together with the description, explain these embodiments. In the drawings:

FIGS. 3A and 3B show an exemplary susceptor and channel detail.

FIGS. 5A and 5B show an exemplary susceptor with textured raised sections.

FIGS. 6A-6D show exemplary susceptors with support ridges.

DETAILED DESCRIPTION OF EXAMPLES OF THE INVENTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to susceptor devices and systems for deposition of thin films, particularly superconducting coated conductors, formed from films deposited on substrate tapes in a CVD and more particularly in a MOCVD reactor. However, the embodiments discussed herein are not limited to such elements. For example, the susceptors disclosed herein have application to other reactor types that utilize a susceptor for heating a substrate of any type, and where build-up or errant deposition may be a problem. Such other reactor types may include, but are not limited to, Pulsed Laser Deposition (PLD), Rotating Cylinder Reactor (RCE) and others.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the described features, structures or characteristics may be combined in any suitable manner in one or more embodiments.

Figure 1:
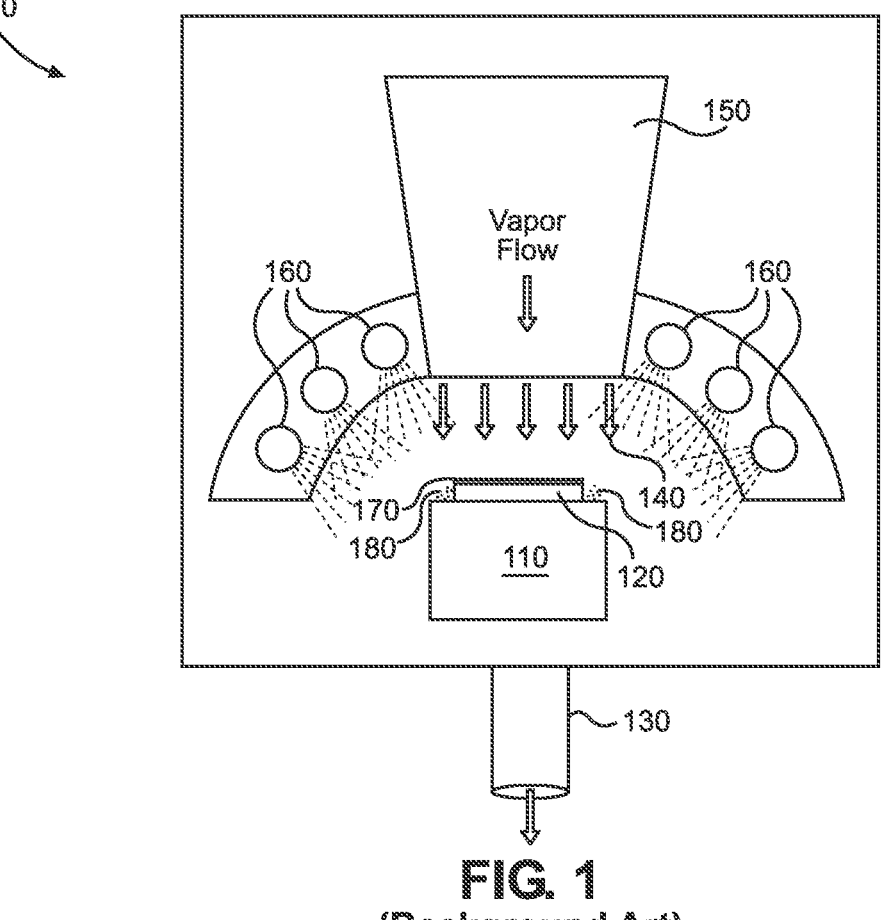
FIG. 1 shows a prior art CVD reactor with errant deposition at the susceptor.
Figure 2:
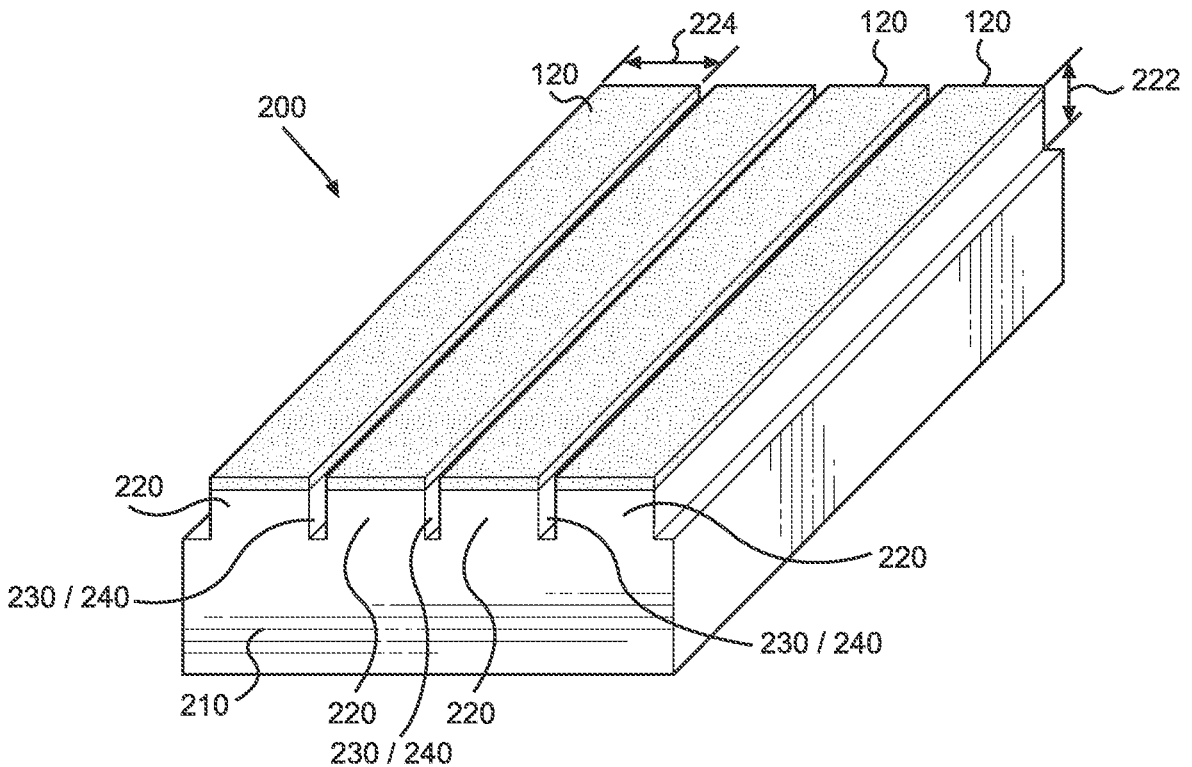
FIG. 2 shows an exemplary susceptor with raised sections and a channel.

An exemplary susceptor for errant deposition control and temperature control of the substrate tape is shown in FIG. 2. In this embodiment, susceptor 200 is comprised of a main body 210 which forms the base of susceptor 200. It is important to note that in such applications, susceptor 200 may be configured to support more than one substrate tape or multiple passes of the same substrate tape 120 that loops via rollers that cause tape 120 to reverse direction and to pass through the reactor deposition zone more than one time. Thus, tape handling configurations described herein may encompass a "single-pass" tape configuration, or a single-length tape with "multi-pass" tape configuration, or several separate tapes running in parallel over susceptor 200 in a "multi-track" configuration. Hence, susceptor 200 main body 210 may include various geometries and dimensions intended to accept all different tape handling configurations as described herein. For simplicity, susceptor 200 of FIG. 2 depicts a four-tape substrate 120 which would also be applicable to four passes of a single tape in a roll-to-roll tape transfer system. The reels or rollers used in single or multi-pass configurations may be located inside the reactor, or outside the reactor with the substrate passing through slits or ports in the reactor walls.

In preferred embodiments, susceptor 200 is manufactured from metal alloy such as Inconel that is machinable and has a suitable thermal conductivity, or alternatively may be composed of Silicon Carbide (SiC). Returning to FIG. 2, two or more raised sections 220 extend vertically from main body 210 and extend lengthwise along the length of susceptor 200. Each raised section 220 is separated from an adjacent raised section 220 by a gap 230 that extends downward to a prescribed depth and forms a channel 240. Raised sections 220 are preferably of the same composition as the main body 210 and may be machined, cast or milled from a single block of material. Other approaches may include laser etching or band saw cutting to produce gaps 230. In other embodiments, it is possible to have the raised sections 220 separate from but operably coupled to the main body 210. In this case, the raised sections 220 may be of the same material as main body 210 or it may be of a different material with different thermal conductivity. In this case, the raised sections 220 may be attached to the main body 210 using different methods; examples include screws or bonding surfaces.

In preferred embodiments, each raised section is shaped with vertical sides 222 thus each section is rectangular in cross section, however, in other embodiments to be discussed later, raised sections 220 may be shaped differently, e.g., trapezoidal.

The width of the top surface 224 of raised section 220 is preferably the same or less than the width of substrate tape 120. For example, in certain embodiments, substrate tape 120 may be nominally 12 mm wide, and thus raised section 220 top surface 224 is 12 mm wide. In other embodiments, raised section 220 top surface may be slightly less in width, thus in this example, top surface 224 may be 10-11 mm wide. Hot block susceptor 200 thus contacts and conductively heats substantially the full width of substrate tape 120 without having a portion of top surface 224 exposed and susceptible to build-up of errant deposition 180.

FIG. 3a shows an eight raised section 220 susceptor 200. FIG. 3b shows an expanded view of gap 230 which forms channel 240 as "detail B" which provides a channel 240 of 10 mm deep with a gap 230 of 1.5 mm wide though other dimensions may be contemplated by those skilled in the art having benefit of the present disclosure. The dimensions of channel 240 may be of greater or less depth, for example, 1 mm, 2 mm, 3 mm, 5 mm or more, to accommodate greater volumes of errant deposition material 180 which may accumulate to greater degree depending on run time, deposition efficiency or other reactor design characteristic. Furthermore, channels may be a shape that is hemispherical in cross-section or other shape. Given that substrate tape 120 is translating and in frictional contact with raised surface 220 that is the same or less width; substantially no deposition material adheres to upper surface 224 of a raised section 220 or the sides of substrate tape 120 and instead deposits into channel 240. In long process runtimes where errant deposition materials 180 may accumulate in channel 240 to a degree that may fill or nearly fill the channel, a purge gas that is suitably inert such argon or nitrogen may be directed along the channel to push material to an end of the susceptor 200 and out towards an outlet of the reactor.

Figure 4A:
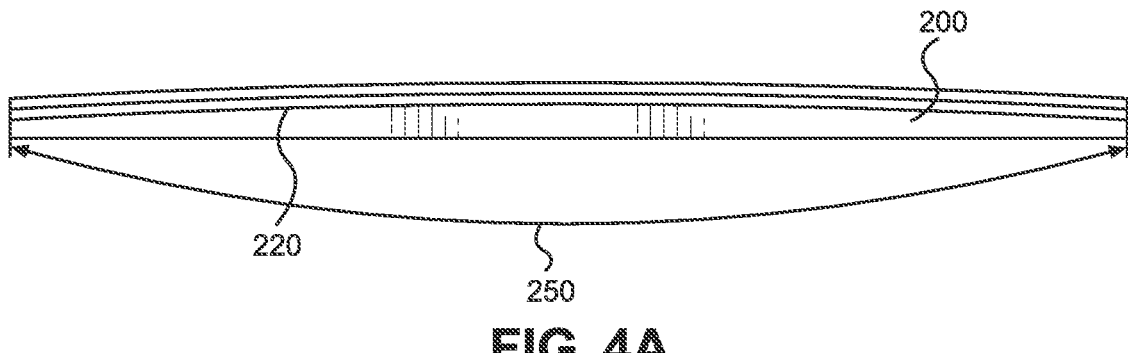
FIGS. 4A and 4B show an exemplary susceptor with curved shape.
Figure 4B:
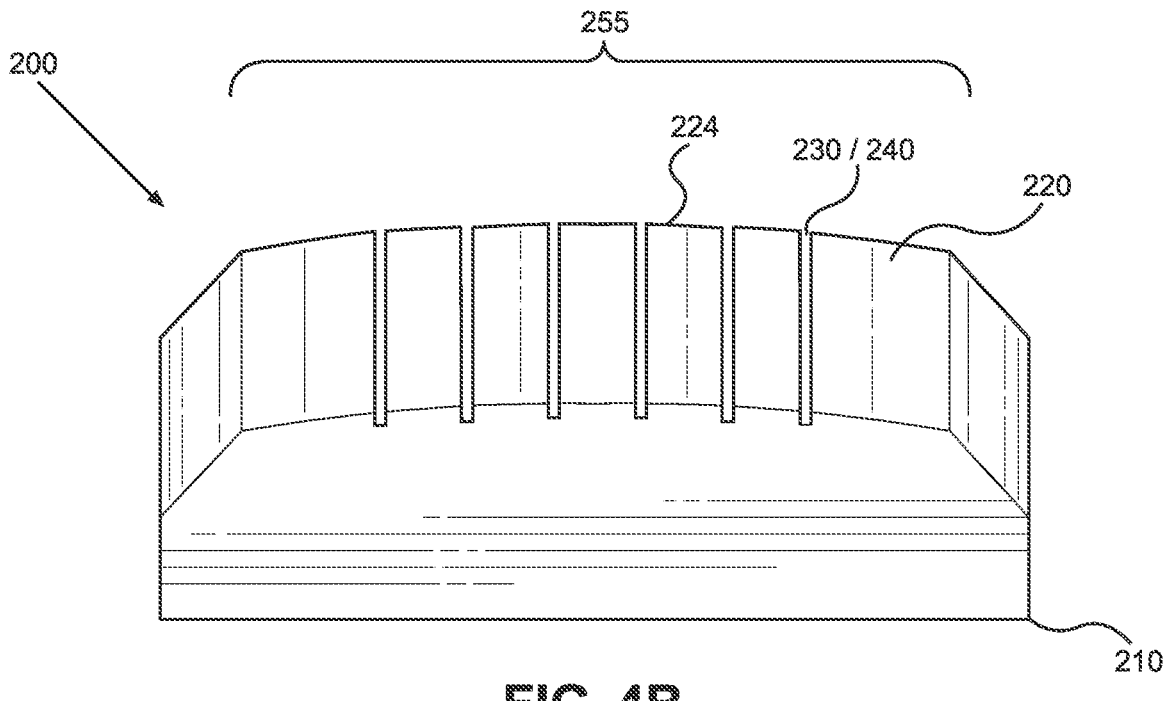

In other embodiments as shown in FIG. 4*a*, susceptor 200 top surface 224 may include a curvature 250 in the lengthwise direction of susceptor 200 to provide tension on substrate tape 120. In this way, the vertical height of a raised section 220 may be greater at the center than at the ends of raised section 220. In the case of raised sections 220 with variable height, channel 240 may be machined such that the channel's depth is a constant depth down the length of the susceptor, for example, follows the curvature of the susceptor. Alternatively, the channel may be machined such that the depth is variable and thus, for example, shallower on the ends and deeper at the center. Similarly, as shown in FIG. 4*b*, top surface 224 may include a curvature 255 in the width dimension of raised section 220. In yet other embodiments susceptor may be curved on more than one dimension, e.g., along the length and width, hence curvatures as shown as 250 and 255 in FIGS. 4A and 4B. In the case of a curved susceptor, a curved or other shape showerhead may be designed to follow the curvature 255.

In yet other embodiments, top surface of raised section 220 may be textured or include micro-protrusions, gaps or imperfections to aid in radiative and conductive heat distribution to evenly heat the substrate tape 120. For example, as shown in FIG. 5*a* and in expanded detail "B" of FIG. 5*b* of top surface 224, micro-texture protrusions 310 of approximately 100 microns in height are shown. Other size and density of textures are thus readily contemplated by those skilled in the art having the benefit of the present disclosure, for example, the micro-textured surface may be comprised of protrusions with an average height of 10 or even single digit microns.

Figure 8:
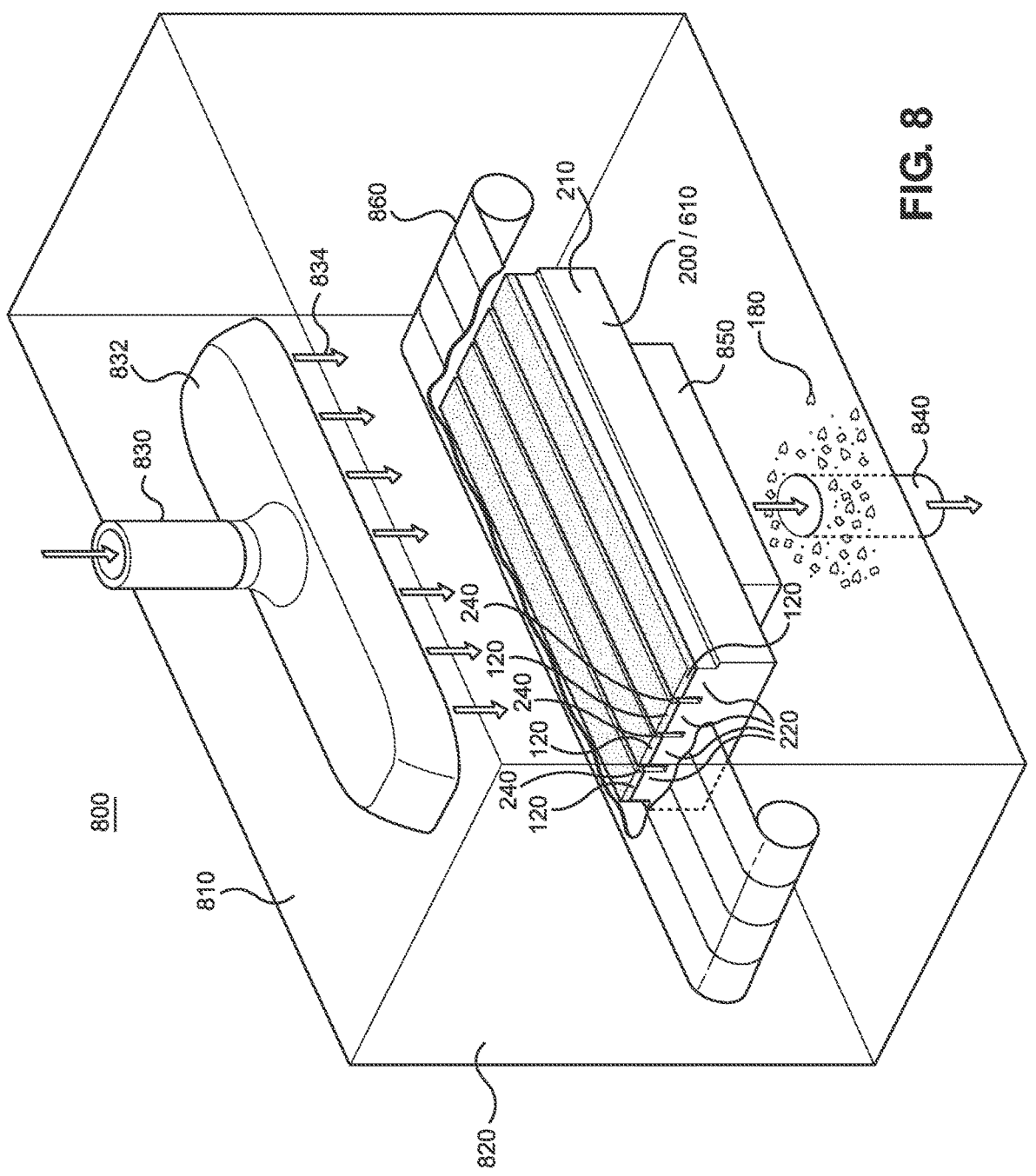
FIG. 8 shows an exemplary reactor system with susceptor.

The growth mechanism occurring during the deposition of thin films on a substrate tape 120 and a susceptor (e.g., 200) will be discussed in order to describe the operation and benefits of channels 240. With reference to FIG. 8, to be discussed in greater detail later, the precursor chemicals are transported by the main inlet gas flow showerhead 832 to the substrate tape(s) 120 after which the reaction and product deposition occurs chiefly inside the thin flow boundary layer on and around the substrate. The boundary layer for example may be similar to the boundary layer of flow over a flat plate. Thus, deposition within the laminar boundary layer uniformly deposits particles over the exposed susceptor surfaces between tapes. When channels 240 are added to the susceptor, the laminar flow boundary layer is disturbed with discontinuities at those locations on the susceptor. Another benefit of the channels includes, for example, that particles flowing into a channel get trapped and tend to remain inside the channel in a circulatory motion until they eventually adhere and are deposited upon an interior wall surface of the channel. Hence adding channels 240 to the susceptor aids in the minimization of particle build-up on the susceptor surfaces between tapes which in turn prevents loose particles from potentially fouling the thin film.

In the susceptor embodiments shown in FIGS. 6*a* and 6*b*, support ridges 620 are located on the upper surface 630 and run preferably along the length of raised sections 220 of susceptor 610 thus elevating substrate tape 120. (Sections of support ridges 620 substantially the same width as the width of a raised section 220 may be positioned at prescribed intervals (e.g., 5 mm, 10 mm, etc.) orthogonal to the length of the raised section.) A radiation gap 640 is thus formed between the substrate tape 120 and the upper surface 630 of a raised section 220. For example, a radiation gap 640 of 300 micrometer to 1000 micrometer or 2 millimeter or more may be used to create the radiation gap 640. This small gap is referred to herein as a "radiation-gap" whereby the hot susceptor radiates heat to the backside of tape to achieve the desired process temperatures. In addition to the radiation heating, substrate tape 120 also heats from small contacts between the support ridges 620 and substrate tape 120. Using support ridges 620, errant deposition particles are prevented from getting under the substrate tape as the support ridges are in constant contact with the substrate tape which seals the radiation-gap 640 under the tape and maintains the tape underside in a clean condition. In this context, the term "seal" occurring at the ridge 620 and tape 120 interface is intended to encompass a minimization of a gap between the tape 120 and the ridges 620 by tension force and/or weight of the tape.

Recognizing that the susceptor load or heat input may need to be increased to achieve even heat distribution across the substrate tape 120 at greater heights of the support ridges 620; support ridges 620 may be of various dimensions and shapes, for example, in preferred embodiments, the ridges are typically machined rectilinear in shape from the base material (e.g., Inconel or SiC) of main body 210 to a height of approximately 1 mm and approximately 0.5 mm to 1 mm in width. As the support ridges 620 increase in height and the radiation gap 640 increases, which adds to the susceptor input requirements, more conductive heating may be applied through the addition of a third or more additional support ridges 620 as shown in FIG. 6*d*. (A single susceptor is shown for simplicity in FIG. 6*d*, however added support ridges in numbers of greater than two are equally applicable to other embodiments including those shown in FIGS. 6*a-c*.) In this approach, radiative heat load is decreased as the radiation gap 640 surface area is reduced and conductive transfer via additional support ridges is increased. Also, support ridges 'I may be shaped as hemispheric in cross section or other shapes.

Like the curvature of susceptor 200 as discussed above and shown in FIG. 4*a*, susceptor 610 may include a lengthwise curvature 250 to add tension to substrate tape 120 thereby providing added downward force to seal the radiation gap 640. Similar to susceptor 200 as shown in FIGS. 2 to 5*b*, each raised section 220 is separated by a gap 230 from an adjacent raised section 220 which forms a channel 240 to collect errant deposition material 180. Also similar to susceptor 200 as shown in FIG. 3*b*, susceptor 610's channel 240 may be approximately 10 mm deep and a width of gap 230 of 1.5 mm wide, though other dimensions may be contemplated by those skilled in the art having benefit of the present disclosure.

In preferred embodiments, support ridges 620 are placed at the outermost edge of raised section 220. The outside width then of two outside support ridges serving the same raised section is then the same (FIG. 6a) or slightly less (FIG. 6b) than the width of substrate 120. Thus, the width of gap 230 which forms channel 240 may be the same as the space between two adjacent substrate tapes as in FIG. 6a or wider than the space between the two tapes as shown in FIG. 6b where the substrate tapes may overhang gap 230. Support ridges 620 may also be positioned inside of the outermost edges of raised section 220 which may increase overhang. Overhang, however, in preferred embodiments is typically minimized to approximately a few tenths of a mm in order to avoid cooler edges of substrate tape 120 caused by the overhang receiving less radiative heat transfer. As with susceptor 200 described above, the spacings between adjacent substrate tapes 120 are determined by the desired channel 240 dimensions in conjunction with the tolerance of the lateral travel or drift of adjacent substrate tapes which is a function of the precision of the reel-to-reel tape feed system used.

In embodiments of susceptors 610 utilizing support ridges 620, an inert gas may be introduced into gap 640 to aid in evenly distributing radiative heat to the underside of substrate tape 120 and/or to remove errant deposition material that may collect under the substrate tape. In preferred embodiments that gas may be Argon, but other inert gas may be used such as nitrogen, helium, or neon owing to its greater thermal conductivity which may be beneficial where gap 640 is larger in height. In preferred embodiments, the purge gas may flow continuously into gap 640 and between support ridges 620 and out an open end, or alternatively the gas may be contained within the gap 640 that is closed at an opposite end of the susceptor and may exit outlets or holes at one or more points along the length of the susceptor. In this respect, the term "contains" or in reference to a gas being "contained" within the gap 640 may refer to a gas flowing through a gap 640 with one or more outlets.

Note that these "support ridged" embodiments are shown in FIGS. 6a and 6b; four substrate tapes 120 are shown, which again may be four individual substrate tapes or one or more individual tapes in a multi-pass configuration as described above. However, in simple reactor systems using either a single susceptor capable of handling one tape, or multiple individual susceptors spaced apart with each supporting its own substrate tape, the support ridge approach is equally suitable as shown in FIG. 6c. Here, individual susceptor 600 utilizes support ridges 620 that form radiation gap 640 as with the support ridge embodiments above, but no channel 240 is present. The ridges in FIGS. 6a-d may have small openings along the length of each ridge to allow the purge gas to exit out of the radiation gap through the openings and removing any errant material.

Figure 7A:
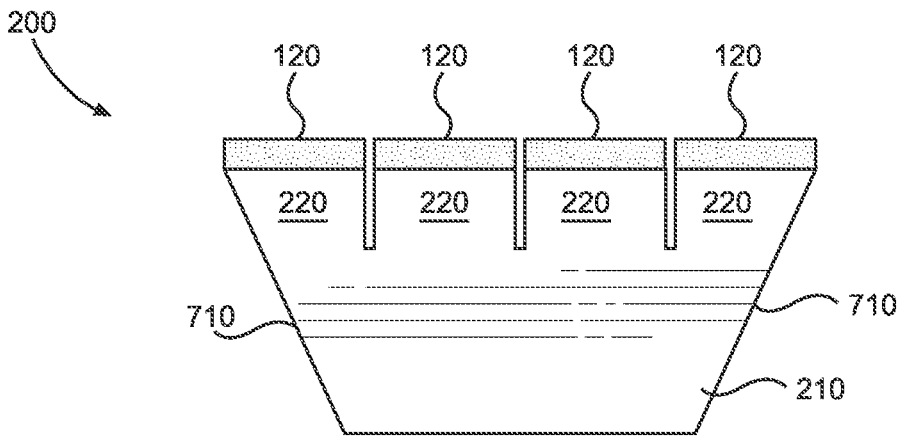
FIGS. 7A-7C show exemplary susceptors with trapezoidal shaped main bodies.
Figure 7B:
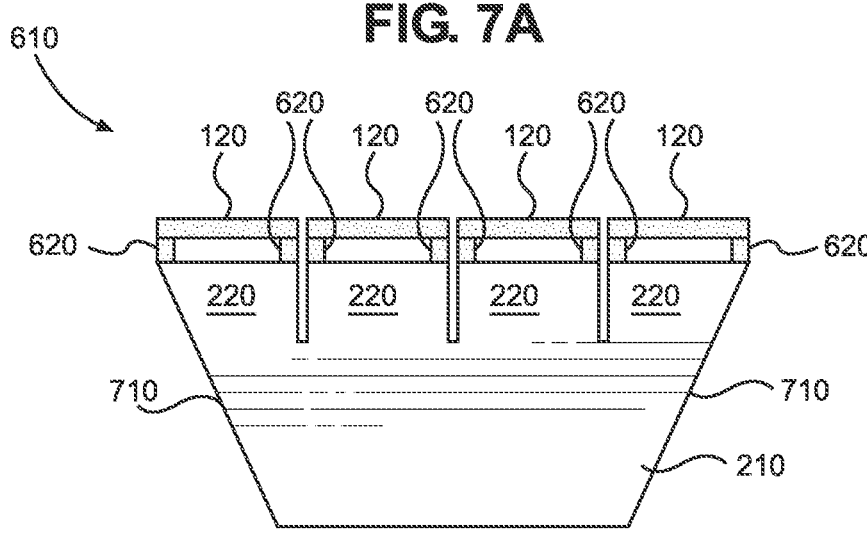
Figure 7C:
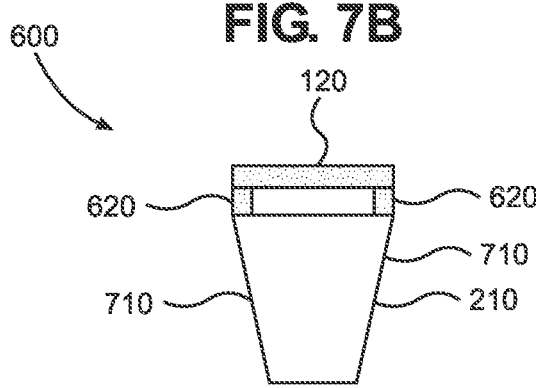

In embodiments of susceptors shown as 200, 600, and 610, the cross-sectional shape of the main body 210 of the susceptor and raised sections may be rectangular in shape. Other shapes are possible however and may impart additional benefits. For example, as shown in FIG. 4b. the ends of raised sections 220 may include a chamfer. Also, as shown in FIG. 7a, side walls 710 of the end raised sections 220 and main body 210 of an exemplary four substrate tape 120 susceptor may be angled inwardly thus providing an inverted trapezoidal shaped susceptor 200. This shape further reduces errant deposition 180 on the sidewalls 710 particularly where the exhaust or reactor outlet is located below the susceptor. Similarly, an exemplary four substrate tape 120 susceptor 610 as shown in FIG. 7b utilizing support ridges 620 may be trapezoidal shaped. Likewise, a single substrate tape 120 susceptor 600 also utilizing support ridges 620 may be trapezoidal shaped as shown in FIG. 7c. In yet other embodiments, the main body 210 may comprise sidewalls angled inwardly while the sidewalls of the raised section(s) 220 are vertical.

An exemplary system 800 for controlling the temperature of a substrate tape 120 utilizing a susceptor 200/600/610 that also provides for control of build-up of errant deposition material 180 in a chemical vapor deposition apparatus 810 for thin film production is shown in FIG. 8. The system 800 may be comprised of a reactor housing 820 operated under vacuum conditions. An inlet 830 and showerhead system 832 for the delivery of one or more precursors 834, e.g., a metal organic compound from an external source (not shown) which could be a direct liquid injection vapor source, or a solid precursor feed system as disclosed in pending International Application No. PCT/US2019/068194 and U.S. National patent application Ser. No. 16/756,462, both of which are assigned to the present Applicant and incorporated by reference herein for all purposes.

In reactor system 800, the bulk of excess or undeposited material 834 exits through one or more vacuum exhaust ports 840, however, as discussed prior, errant material 180 deposits and builds up on various surfaces within the reactor. In the present system, a susceptor (200/600/610) as described above is positioned within reactor housing 820 and is configured to be heated by resistive type heater 850 and provides at least one channel 240 for the collection of errant deposition material 180. Heater 850 may also be a non-contact type reliant upon radiative heat transfer, for example halogen lamps or SiC glow bars. As compared to prior art susceptors that permit deposition to occur on the susceptor and proximate to the substrate tape which could foul or disturb the physical integrity and/or performance characteristics of the deposited thin film, the channels 240 disclosed herein mitigate the build-up of material near the substrate.

As shown in FIG. 8, susceptor 200 is comprised of a main body 210 which forms the base of susceptor 200 (for simplicity, the susceptor may be referred to herein as susceptor "200" but which may take the structure of any of the above susceptors 200, 600, or 610). In this system embodiment of FIG. 8, susceptor 200 is shown to support four substrate tapes 120 (depicted as transparent in order to show susceptor details underneath the tapes). However, as discussed prior, the susceptor 200 may be configured to support any number of substrate tapes 120 and/or accommodate multiple passes of the same substrate tape or tapes. As shown, reels 860 used in single or multi-pass configurations may be located inside the reactor. However, substrate tape(s) 120 may also be fed and gathered external to reactor housing 820 via external payout and take-up reels or rollers 860.

Though channels 240 may be present at any location of susceptor 200 according to preferred embodiments, the channels occur between raised sections 220 as discussed above. For example, with reference to FIG. 2, two or more raised sections 220 extend vertically from main body 210 and extend lengthwise along the length of susceptor 200. Each raised section 220 is separated from an adjacent raised section 220 by a gap 230 that extends downward to a prescribed depth and forms one or more channel(s) 240. The width of the top surface 224 of raised section 220 is preferably the same or less than the width of substrate tape 120.

With reference to FIGS. 4a-5b, as applied to system 800, susceptor 200 of system 800 may include a top surface 224 with a curvature 250 in the lengthwise direction of susceptor 200 to provide tension on substrate tape 120. In this way, the vertical height of susceptor 200 may be greater at the center than at the ends of susceptor 200. Similarly, the top surface of susceptor 200 or of raised section 220 may be textured or include micro-protrusions, gaps or imperfections to aid in radiative heat distribution to evenly heat the substrate tape 120.

Support ridges 620 as shown in FIG. 6a-6d may also be located on the upper surface 630 and run preferably along the length of raised sections 220 of susceptor 610 thus elevating substrate tape 120 in system 800. Also, susceptor 610 may include a lengthwise curvature 250 to add tension to substrate tape 120 thereby providing added downward force to the substrate tape to seal the radiation gap 640 described above and in shown in FIGS. 6-6d. Furthermore, the susceptor (200/600/610) of system 800 may be trapezoidal or other shape as shown for example in FIGS. 7a-7c.

What is claimed is:

1. A susceptor system (200) for heating and temperature control of a substrate tape (120) and for the control of errant deposition build-up (180) within a deposition apparatus, the susceptor system (200) comprising:
   a susceptor;
   a substrate tape disposed above and in contact with the susceptor;
   a main body (210) forming a base of the susceptor (200); and
   two or more adjacent raised sections (220) each extending vertically from the upper surface of the main body (210) and lengthwise along the length of the main body (210) with the top (224) of each raised section having a width substantially the same or less than the width of the substrate tape (120),
   wherein each raised section (220) is separated by a gap (230) from an adjacent raised section (220), and
   wherein the gap (230) separating adjacent raised sections (220) forms a channel (240) to collect errant deposition material (180).

2. The susceptor system of claim 1, wherein the main body further comprises sidewalls angled inwardly to form a trapezoidal cross section.

3. The susceptor system of claim 1, wherein the top surface of raised section curved in the lengthwise direction of the susceptor such that the vertical height of raised section is greater at the center of the susceptor than at the ends of the susceptor.

4. The susceptor system of claim 1, wherein the channel cross-sectional area is rectilinear in shape.

5. A susceptor system (610) for heating and temperature control of a substrate tape (120) and for the control of errant deposition build-up (180) within a deposition apparatus, the susceptor system (610) comprising:
   a susceptor;
   a substrate tape disposed above and in contact with the susceptor;
   a main body (210) forming a base of the susceptor (610); and
   two or more adjacent raised sections (220) each extending vertically from the upper surface of the main body (210) and lengthwise along the length of the main body (210),
   wherein the top (224) of each raised section (220) further comprises two or more support ridges (620) configured to elevate substrate tape (120) such that the bottom of said substrate tape (120) does not contact the raised section (220) top surface (630), and wherein the distance between outermost edges of two support ridges (620) of each raised section (220) is substantially the same or less than the width of the substrate tape (120), and
   wherein each raised section (220) is separated by a gap (230) from an adjacent raised section (220), and
   wherein the gap (230) separating adjacent raised sections (220) forms a channel (240) to collect errant deposition material (180).

6. The susceptor system of claim 5, wherein the main body further comprises sidewalls angled inwardly to form a trapezoidal cross section.

7. The susceptor system of claim 5, wherein the top surface of raised section curved in the lengthwise direction of the susceptor such that the vertical height of raised section is greater at the center of the susceptor than at the ends of the susceptor.

8. The susceptor system of claim 5, wherein the space between the bottom of the substrate tape and the top of raised section contains an inert gas.

9. A susceptor system (600) for heating and temperature control of a substrate tape (120) within a deposition apparatus, the susceptor system (600) comprising:
   a susceptor;
   a substrate tape disposed above and in contact with the susceptor;
   a main body (210) forming a base of the susceptor (600); and
   two or more support ridges (620) located on the upper surface of the main body and are configured to elevate the substrate tape (120) such that the bottom of said substrate tape (120) does not contact the upper surface of the main body of the susceptor (600).

10. The susceptor system of claim 9, wherein the main body further comprises sidewalls angled inwardly to form a trapezoidal cross section.

11. The susceptor system of claim 9, wherein the top surface of the susceptor is curved in the lengthwise direction to provide tension to the substrate tape such that the vertical height at the center of the susceptor is greater than the ends of the susceptor.

12. The susceptor system of claim 9, wherein the space between the bottom of the substrate tape and the top of the main body of the susceptor contains an inert gas.

13. A system (800) for heating and temperature control of a substrate tape (120) and control of errant deposition build-up (180) within a chemical vapor deposition apparatus, the system (800) comprising:
   a chemical vapor deposition apparatus (810) comprising a reactor housing (820) having an inlet (830) for a precursor (834) and a vacuum exhaust (840);
   a susceptor (200/600/610) located within the reactor housing (820);
   a substrate tape (120) configured to translate along the top the susceptor (200/610) and through the reactor housing (820);
   a heater (850) operatively coupled to the susceptor (200/600/610);
   wherein the susceptor further comprises a main body (210) and at least one raised section (220) extending vertically from the upper surface of the main body (210) and lengthwise along the length of the main body (210) with the top (224) of each raised section having a width substantially the same or less than the width of the substrate tape (120); and wherein the susceptor (200/600/610) further comprises a channel (240) configured for collection of errant deposition build-up (180).

14. The system of claim 13, wherein each of the at least one raised section (220) further comprises two or more support ridges (620) configured to elevate substrate tape (120) such that the bottom of said substrate tape (120) does not contact the raised section (220).

15. The system of claim 14, wherein the distance between outermost edges of two support ridges (620) of each of at least one raised section (220) is substantially the same or less than the width of the substrate tape (120).

16. The system of claim 14, wherein the space between the bottom of the substrate tape and the top of each of at least one raised section contains an inert gas.

17. The system of claim 13, wherein the channel cross-sectional area is rectilinear in shape.

18. The system of claim 13, wherein the top surface of each of the at least one raised section is curved in the lengthwise direction of the susceptor such that the vertical height is greater at the center of the susceptor than at the ends of the susceptor.

19. The system of claim 13, wherein the susceptor main body further comprises sidewalls angled inwardly to form a trapezoidal cross section.

* * * * *